United States Patent [19]
Mathew

[11] Patent Number: 5,814,942
[45] Date of Patent: Sep. 29, 1998

[54] METHOD AND APPARATUS FOR GENERATING HIGH-DENSITY SHEET PLASMA MIRRORS USING A SLOTTED-TUBE CATHODE CONFIGURATION

[75] Inventor: Joseph Mathew, Silver Spring, Md.

[73] Assignee: The United States of America as represented by the Secretary of the Navy, Washington, D.C.

[21] Appl. No.: 827,517

[22] Filed: Mar. 28, 1997

[51] Int. Cl.⁶ .................................................. H05H 1/50
[52] U.S. Cl. .......................... 315/111.41; 313/231.41
[58] Field of Search ................ 315/111.41, 111.71; 313/231.31, 231.41, 632, 491; 219/121.25, 121.36

[56] References Cited

U.S. PATENT DOCUMENTS

| | | | |
|---|---|---|---|
| 4,728,862 | 3/1988 | Kovarik et al. | 315/111.01 |
| 5,132,597 | 7/1992 | Goebel et al. | 315/111.41 X |
| 5,182,496 | 1/1993 | Manheimer et al. | 315/111.41 |

OTHER PUBLICATIONS

Mathew et al., Electronisally Steerable Plasma Mirro for radar applications, Proc. IEEE Intl. Rad. Conf., pp. 742–747, May 1995.

Meger et al., Experimental Investigations of the Formation of a Plasma Mirror for High–Frequency Microwave Beam Steerings, Phys.Plasma,vol. 2, No. 6 pp. 2532–2538, Jun. 1995.

Mathew et al., Retarding Field Energy Analyzer for the Characterization of Negative Glow Sheet Plasmas in a Magnetic Field, Rev.Sci.Instrum vol. 67, No. 8, pp. 2818–2825, Aug. 1996.

Mathew et al., Generation of Large Area, Sheet Plasma Mirror for Redirecting High Frequency Microwave Beams, Phys.Rev.Ltrs,vol. 77, No. 10, pp. 1982–1985, Sep. 1996.

*Primary Examiner*—Robert J. Pascal
*Assistant Examiner*—Justin P. Bettendorf
*Attorney, Agent, or Firm*—Thomas E. McDonnell; Charles Stockstill

[57] ABSTRACT

A method and apparatus for generating high-density sheet plasma mirrors having a longitudinally slotted cathode, circular in shape, having an inner cavity and a slot of a predetermined width positioned along the length of the cathode. A discharge voltage is applied to the cathode within a vacuum chamber which is backfilled with gasses like oxygen and argon, or mixtures thereof, which in cooperation with a magnetic field, which is higher than the threshold field, causes electrons to flow through the slot in the cathode to an anode, positioned a predetermined distance from the cathode, thereby generating a high-density plasma sheet immersed in the magnetic field of a width and thickness proportional to the size of the slot in the cathode.

4 Claims, 5 Drawing Sheets

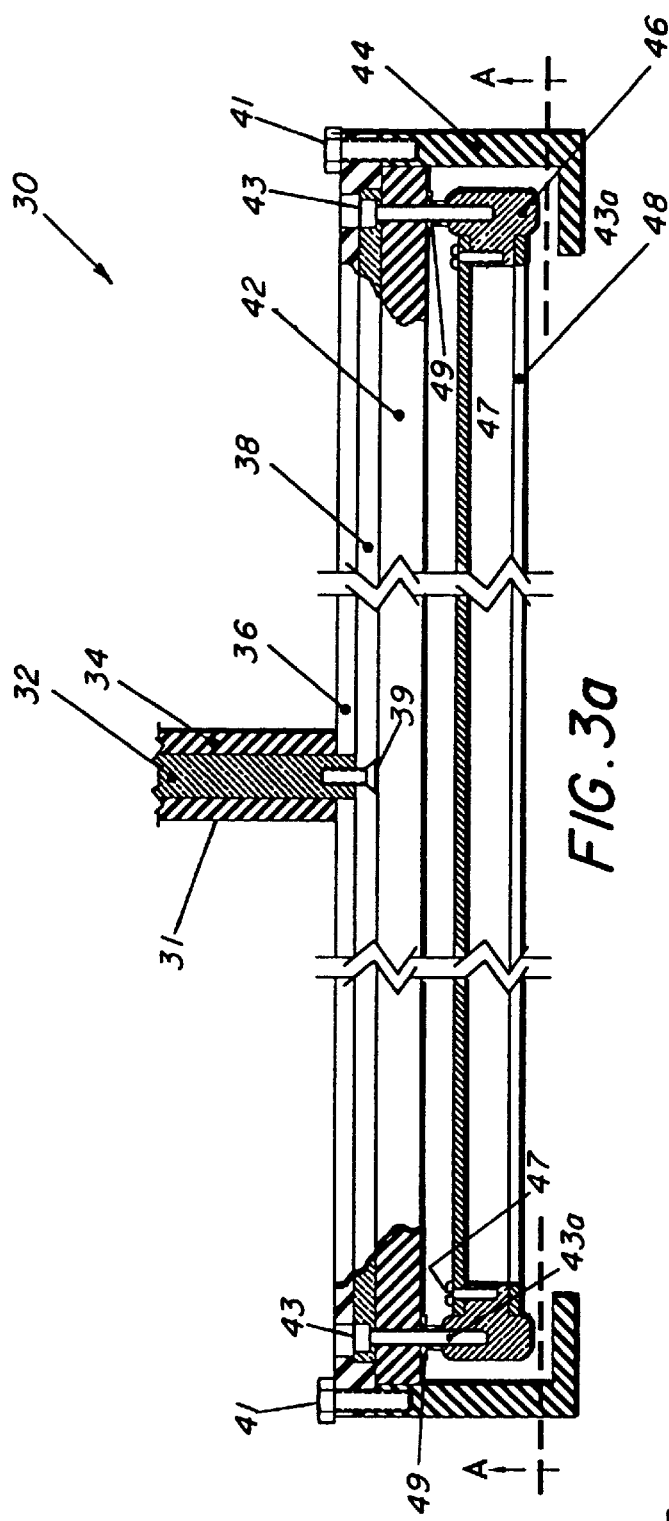
FIG. 3a
FIG. 3c
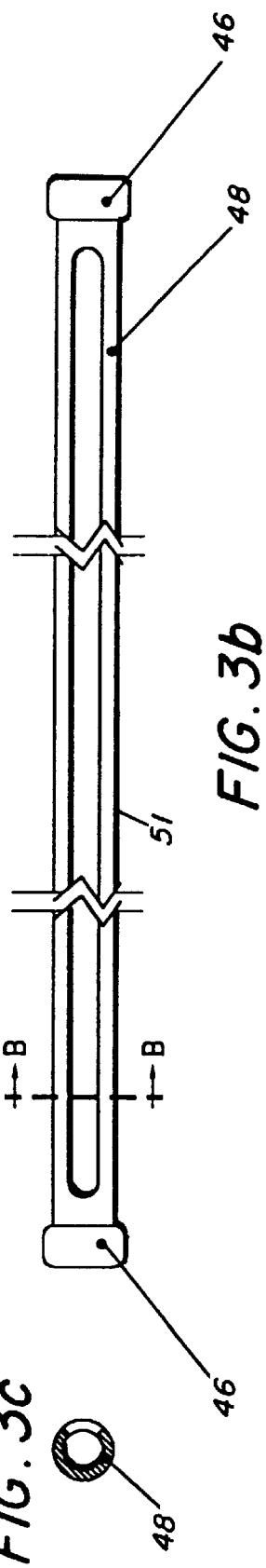
FIG. 3b

METHOD AND APPARATUS FOR GENERATING HIGH-DENSITY SHEET PLASMA MIRRORS USING A SLOTTED-TUBE CATHODE CONFIGURATION

BACKGROUND OF THE INVENTION

1. Field of the Invention

This invention pertains generally to sheet-plasma mirrors and more particularly to the slotted-tube-cathode electrode configuration for efficiently generating large area, quiescent, steerable, sheet-plasma mirrors for redirecting high frequency microwave beams.

2. Description of the Related Art

Experiments using hollow cathodes with rectangular cross section have demonstrated that planar plasma mirrors can be formed with densities high enough to reflect X-band microwave beams. These experiments have been described in R. A. Meger et al., *Experimental Investigations of the Formation of a Plasma Mirror for High Frequency Microwave Beam Steering*, Physics of Plasmas, Vol. 2, p. 2532, 1995. The plasma discharge is formed by driving a negative glow discharge between a linear hollow cathode and a flat plate anode. The discharge is immersed in a magnetic field of strength 250 G. When a 30 cm diameter X-band dish is used to illuminate the plasma mirror, the far field radiation pattern of the reflected beam is very similar to the pattern of the beam reflected from a metal mirror of comparable dimensions. See, J. Mathew et al., *Electronically Steerable Plasma Mirror for Radar Applications*, Proceedings IEEE International Radar Conference, Alexandria, U.S.A., pp. 742–747, May 1995.

The plasma mirror may be made agile by forming the mirror in one location, turning it off for a short duration and then reforming it in another orientation. The decay of plasma density is governed by ion-electron recombination. Since the recombination times are typically less than 10 $\mu$s, the switching time between successive mirror orientations may also be less than 10 $\mu$s if the volume (horizontal steering) magnetic field can be changed on these time scales. For plasma mirrors larger than 1 m$^2$, the beam switching speed may be $\leq 20\,\mu$s; mirrors smaller than 1 m$^2$ may be reoriented in less than 10 $\mu$s.

Recent experiments using a retarding field energy analyzer have shown that the negative glow plasmas are being actively sustained by the ionization of the background gas by the energetic beam electrons emitted by the cathode. The beam electron density is only ~0.01% of the plasma electron density. See, J. Mathew et al., *Retarding Field Energy Analyzer for the Characterization of Negative Glow Sheet Plasmas in a Magnetic Field*, Rev. Sci. Instrum., Vol. 67, P. 2818, 1996. Additional experiments with various cathode geometries have shown that the cathodes generating high density sheet plasmas operate in a mode called the enhanced glow that appears to be distinctly different from the abnormal glow and hollow cathode modes. See, J. Mathew et al., *Generation of Large Area Sheet Plasma Mirrors for Redirecting High Frequency Microwave Beams*, Phys. Rev. Lett., Vol. 77, pp. 1982–1985, 1996. These experiments have provided an experimental data base for the design of improved cathodes. The aspect ratio (cavity width to depth ratio) of "enhanced glow" cathodes should be 1.3:1 to ensure operation in a mode that generates a high density plasma sheet. A deep hollow cathode gives high discharge currents, but it is not useful for generating high density sheet plasmas because the discharges obtained have very low electron densities characteristic of positive columns. The secondary electrons emitted from the cathode surface (due to ion bombardment) interact with the vertical magnetic field which causes a drifting motion of these electrons within the cathode cavity in a longitudinal direction perpendicular to the magnetic field. This motion tends to make the plasma density uniform across the width of the plasma sheet.

The basic technique of generating a reflective plasma sheet using a linear hollow cathode is shown in U.S. Pat. No. 5,182,496, Manheimer et al., entitled *Method and Apparatus for Forming an Agile Plasma Mirror Effective as a Microwave Reflector*, referred to henceforth as the '496 patent. However, a detailed investigation of the properties of the cathode described in the '496 patent establishes that it is not appropriate for use in a radar application because it does not have the desired properties. The cathode mount in the '496 patent is shown in FIG. 1. The cathode mounting arrangement 10, FIG. 1, confines the discharge current primarily to the inside surface of the cathode cavity, and it avoids discharge initiation from the outside surfaces of the hollow cathode 12. This is in part due to the collimator plate 15. If the cathode 12 is operated without this mount, most of the current goes to the outside surface of the hollow cathode 12, and since the hollow cathode effect is not operational for such a discharge the plasma electron density is at least ten times smaller, and two plasma sheets are obtained instead of a single homogeneous sheet. Therefore, the cavity mount is essential to help confine the discharge to the cathode 12 cavity, which results in high plasma density due in part to the reflexing electrons within the cavity. However, a cathode mount 16 introduces triple points 18 which could be sources for localized electron emissions. Triple points 18 are junctions where metal, dielectric and vacuum meet. If an acute angle is formed between the metal and dielectric surfaces, the local electric field there is infinite. The triple point 18 shown in FIG. 1 is in the region of lower electric field. Even so, the field enhancement at the triple point is sufficiently large to cause substantial electron emissions. The higher the discharge voltage, the more severe these emissions are. The physical mechanisms driving these oscillations are not presently known. The parasitic discharge path 14 indicated in FIG. 1 is inferred from observations of light emissions from numerous hollow cathode geometries. This discharge is aided in some manner by the presence of dielectric surfaces next to the cathode 12; the magnetic field also plays a role. It is believed that the parasitic discharge carries a small fraction of the total discharge current. The main discharge path 13 indicated in FIG. 1 carries most of the current. Experimentation has shown that the cathode 12 described in the '496 patent has coherent oscillations in the thrutransmitted signal that may be due to the parasitic discharge 14 coming from the cathode 12. Such oscillations are undesirable because they will in all likelihood result in high frequency fluctuations in the phase of the reflected microwave beam, and they will clearly limit the clutter rejection capabilities of a plasma based radar system.

These oscillations can be avoided by potting the hollow cathode 12 in an epoxy material 22, as shown in FIG. 2. However, such a cathode 12 has operating problems at discharge voltages in excess of 4.0 kV due to arcing at the triple points 18 since these triple points are in a region of high electric field one conclusion, derived from the large time variations observed in the discharge current, is that this particular cathode 12 shape is not appropriate for miniaturization. The large physical size of such a cathode 12 configuration also makes it unsuitable for building a densely packed array of linear cathodes.

To overcome these difficulties an attempt was made at the Naval Research Laboratory to find improved cathode geometries. It was found that a slotted-tube cathode, as described in this invention, generated high density plasmas nearly five times more efficiently than the cathode described in the '496 paten without the undesirable oscillations, could be operated without an external collimator, and, because of its small physical size, a large number of such cathodes may be densely packed to form an azimuthal array.

Also, it is noted that pseudospark cathodes can generate very high currents beams at low voltages, however, their pulse widths are smaller than 1 μs. The high currents cause accelerated evaporation of the cathode material which makes these cathodes unreliable at moderate-to-high duty factors. The pulse-width limitation also makes them inappropriate for use in a radar application.

SUMMARY OF THE INVENTION

The object of the invention is to provide a cathode that generates a quiescent plasma sheet-discharge that exhibits no high-frequency oscillations in the discharge current or in the location of the critical surface.

Another object of this invention is to provide a cathode with greatly superior performance characteristics over the prior art, such as, a cathode that can be operated "bare" (uninsulated) without the need for an external collimator and having no triple points.

Another object of the invention is to provide a cathode with physical dimensions such that a large number of such cathodes may be densely packed to form an azimuthal array of linear cathodes in order to have the capability of steering a radar beam in the azimuthal path.

Another objective of this invention is to provide a cathode that it is capable of generating large area, high density, plasma sheets more efficiently than the prior art.

Another objective of this invention is to provide a cathode for a plasma mirror based radar that is of low cost, has high microwave-power-handling capability, and has very large instantaneous bandwidth which offers great freedom in the choice of radar transmit waveforms.

These and other objectives are accomplished utilizing the slotted-tube-cathode assembly in a pumped cylindrical vacuum chamber in combination with a flat-plate anode placed below the cathode with the discharge immersed in a magnetic field. The driver for the plasma mirror uses a storage capacitor and a Crossatron switch to generate square voltage pulses of variable pulse widths. The high density plasma mirror is formed when a negative glow discharge is driven via a current limiting resistor between the slotted-tube-cathode and the flat plate anode.

BRIEF DESCRIPTION OF THE DRAWINGS

FIG. 3a shows a slotted-tube cathode and its mounting arrangement.

FIG. 3b shows a cross section A—A of the slotted tube cathode.

FIG. 3c shows a cross section B—B of the slotted tube cathode.

BRIEF DESCRIPTION OF THE PREFERRED EMBODIMENTS

Figure 1:
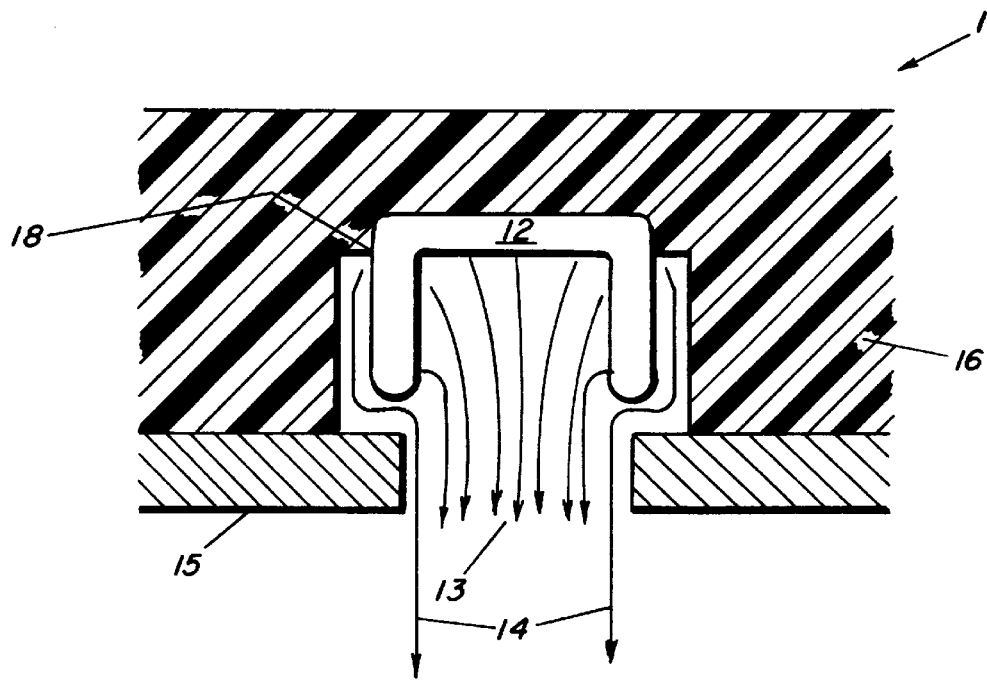
FIG. 1 shows a linear hollow cathode that confines the discharge current primarily to the inside surface of the cathode cavity, and it minimizes discharge initiation from the outside surfaces of the hollow cathode, as shown in the prior art.
Figure 2:
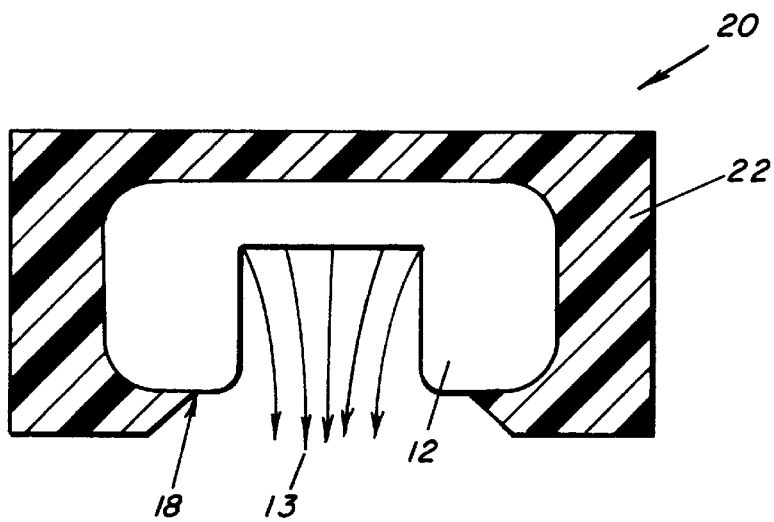
FIG. 2 shows a hollow cathode potted in an epoxy material.

In the preferred embodiment of the slotted-tube cathode 30, as shown in FIG. 3a, a vacuum feedthrough 31 comprised of a cathode stalk 32, preferably a 1.34 cm diameter brass rod, capable of carrying a discharge current at voltages in the 1–10 kV range is inserted into a non-conducting sleeve 34, preferably Nylon®. The outer diameter of the vacuum feedthrough 31 is optimally 2.5 cm in diameter. The sleeve 34 is epoxyed to the cathode stalk 32 to avoid vacuum leaks and insulates the cathode stalk 32, thereby avoiding arcing problems.

The sleeve 34 presses against a non-conducting plate 36, preferably Plexiglass® approximately 3.8 cm wide, 1.2 cm high, and 68.8 cm long. Due to the fit between the sleeve 34 and the plate 36, there is no air gap between these surfaces, therefore no discharge current can flow to the cathode stalk 32. The plate 36 is milled so as to form a slot wherein a busbar 38, preferably brass approximately 1.3 cm wide, 0.6 cm high and 65.4 cm long is fitted. The busbar 38 is attached to the cathode stalk 32 by flat-head screws, preferably 10–32, and is counterbored at each end to receive socket-head screws, preferably 10–32 also. The non-conducting plate 36 is attached to a base plate 42, preferably Plexiglass®, approximately 10.2 cm wide, 1.3 cm high, and 66.7 cm long using screws, preferably ¼-20, going into blind-tapped holes in the base plate 42. The base plate 42 has two clearance holes drilled in it to allow passage of the socket-head screws 43.

Two L-shaped non-conducting brackets 44, preferably Nylon®, are mounted at the two ends under the plate 36 using two ¼-20 screws 41. These brackets 44 are approximately 10.2 cm wide, 5.4 cm high, and the bottom lip is approximately 3.5 cm long and 0.6 cm thick. Two endpieces 46, preferably brass, cap the two ends of a tubular shaped cathode 48, preferably made of SS-304 stainless steel. Each end-piece 46 has a finger, approximately 1.3 cm in diameter and 0.9 cm long, that slides into the end of the cathode 48 where it is attached with a screw 47, preferably a 6-32 machine screw. The head of the screw 47 does not emit electrons because it is in the low (electric) field region between the busbar 38 and the cathode 48 (where the magnetic field is vertical). The exposed portion of the end-piece 46 is approximately 2.5 cm in diameter and 1.3 cm long. The two end-pieces 46, and the cathode 48, are mechanically supported from the busbar 38 by the two socket-head screws 43 and two non-conducting spacers 49, preferably Nylon®. This mounting also provides electrical connection between the cathode 48 and the busbar 38, and hence the cathode stalk 32. The spacers 49 maintain approximately a 0.6 cm gap between the baseplate 42 and the end-pieces 46, as well as preventing emissions from the screw 43 threads. An approximately 0.6 cm wide, 1 cm long spotface-area around the tapped hole 43a in the end-piece 46 ensures a gap-free joint between the non-conducting spacer 49 and the end-piece 46. The outer diameter of the end-piece 46 serves as a field shaper to lower the electric field around the square cut ends of the cathode 48.

The cathode 48, as shown in FIG. 3b formed from, preferably, a cold-drawn, seamless stainless steel tube (SS-304) having an inner diameter of approximately 11.3 cm and an outer diameter of approximately 1.9 cm, a cross section of which is shown in FIG. 3c. The cathode 48 of machined construction and the inside and outside surfaces of the tube forming the cathode 48 need not be polished. The finished cathode 48 tube is approximately 62.7 cm long and has an approximately 61 cm long, 0.95 cm wide slot machined into it, as shown in FIG. 3b, the far edges of the slot should be carefully radiused and, during machining, care should be taken to avoid cutting into the inside surface of the cathode 48 tube. Prior to installing the cathode 48 tube into the assembly and pumping down vacuum chamber 54 (FIG. 5), the machined edges should be carefully sanded down using a 600-grit sandpaper and then cleaned with ethyl alcohol.

Figure 4B:
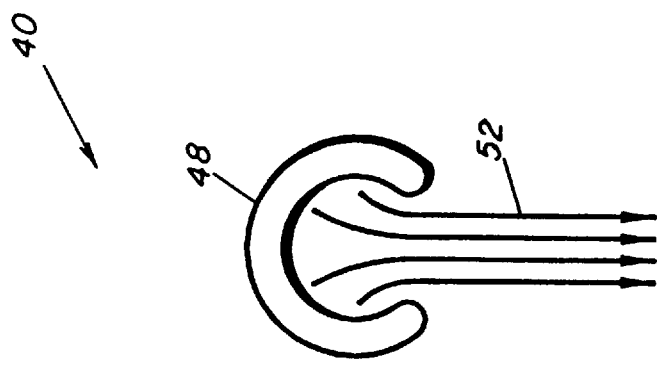
FIG. 4b shows a slotted-tube cathode where the electron discharge is confined to the inside cathode surface, which occurs when the magnetic field strength is higher than the transition field.
Figure 4A:
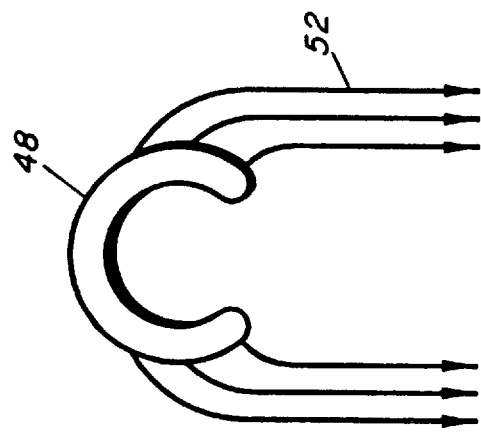
FIG. 4a shows a slotted-tube cathode where the electron discharge is confined to the outside cathode surface.

A distinctive feature of the slotted-tube cathode 48 is the strong dependence of the discharge pattern on the strength of the magnetic field employed. For a given discharge voltage, there is a magnetic field threshold below which the discharge is confined to the outside cathode 48 surface, as shown in FIG. 4a. Above this transition field (roughly 150 Gauss), the discharge is intense and is almost completely confined to the cathode 48 cavity, as shown in FIG. 4b. The latter is the desired discharge configuration for generating high density sheet plasmas. The magnetic field is aligned with the arrows in both FIGS. 4a and 4b.

Figure 5:
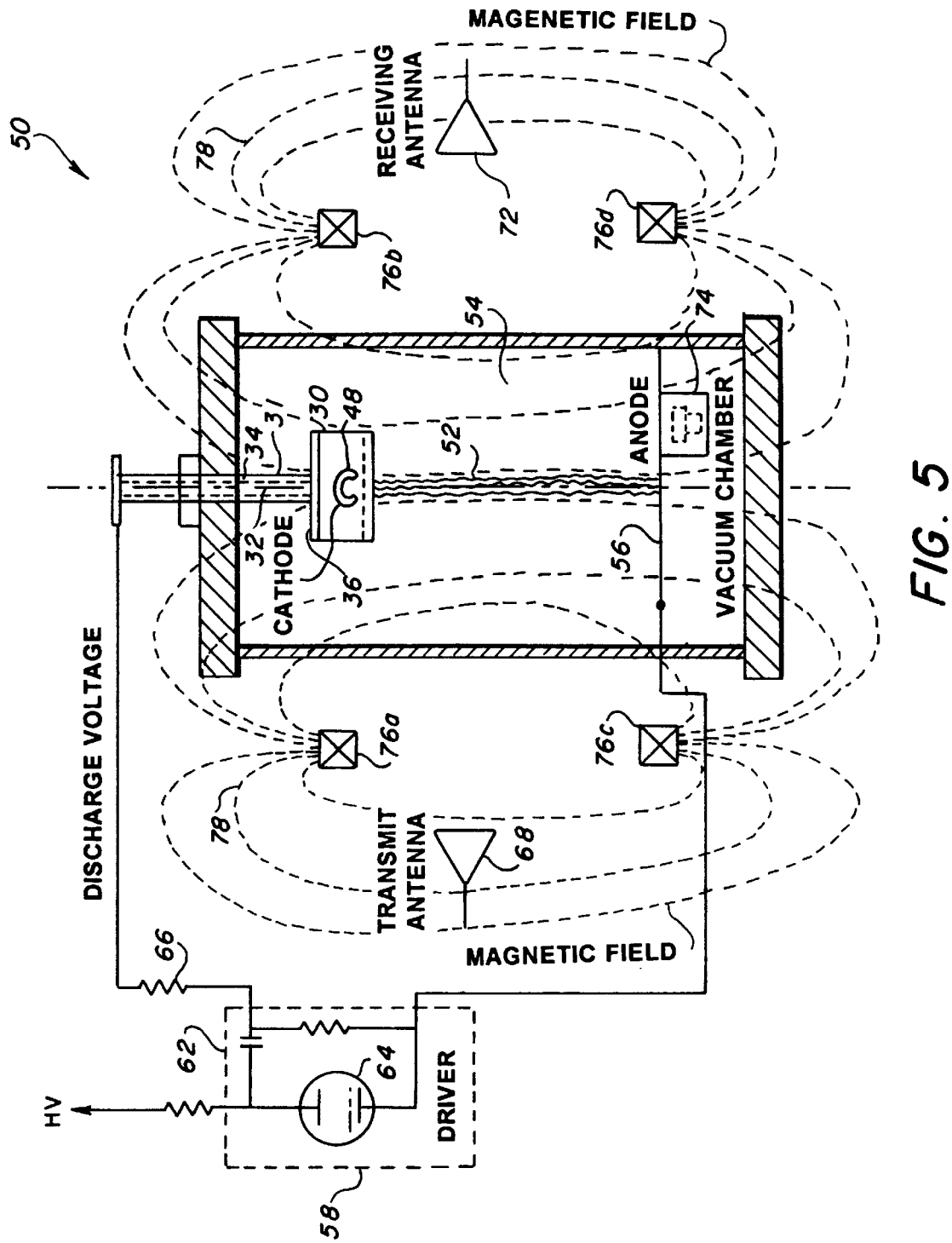
FIG. 5 shows a test apparatus for generating high-density sheet plasma mirrors utilizing a slotted tube cathode.

Referring now to FIG. 5, in a test setup, sheet-plasma mirrors 52, approximately 60 cm×60 cm×1 cm, are formed using the cathode Assembly 30 in a cylindrical vacuum chamber 54, preferably one having a 1.2 cm thick Lexan® (ie. polycarbonate plastic) wall. The inner diameter of the chamber 54 is approximately 79 cm and the height is approximately 81 cm. See R. A. Meger et al., *Physics of Plasmas*, Vol. 2, p. 2532, 1995, which is hereby incorporated by reference in its totality. The chamber 54 is pumped with, preferably a 13 cfm roughing pump, to a base pressure of approximately 8 mTorr. Two mixtures of gas within the vacuum chamber have been found to be preferential, first, ~50 mTorr of oxygen, or secondly, ~33 mTorr of oxygen plus ~12 mTorr argon. An approximately 3 mm thick flat-plate anode 56, having an approximate diameter of 58 cm, is placed approximately 60 cm below the cathode 48. The discharge is immersed in a magnetic field 78 of a strength of 150–300 G generated by a Helmholtz coil pair 76a and b located in line with the cathode 48 and 76c and d located in line with the anode 56. The driver 58 for the plasma mirror 52 uses an approximately 60 μF energy storage capacitor 62 and a Crossatron switch 64 to generate square voltage pulses of variable pulse widths. See, J. Mathew, *Crossatron-based modulator for high repetition rate operation with arbitrary pulse widths*, Rev. Sci. Instrum., Vol. 65, p.3756, 1994, which is hereby incorporated by reference in its entirety. These devices are well known to those skilled in the art. The driver 58 applies negative glow discharges via a 80Ω current limiting resistor 66. The pulse duration of a typical negative glow discharges is 300 μs, and the repetition rate is 0.5 Hz. However, discharges with 10 ms pulse widths may also be formed.

Figures 6A, 6B, 6C, 6D:
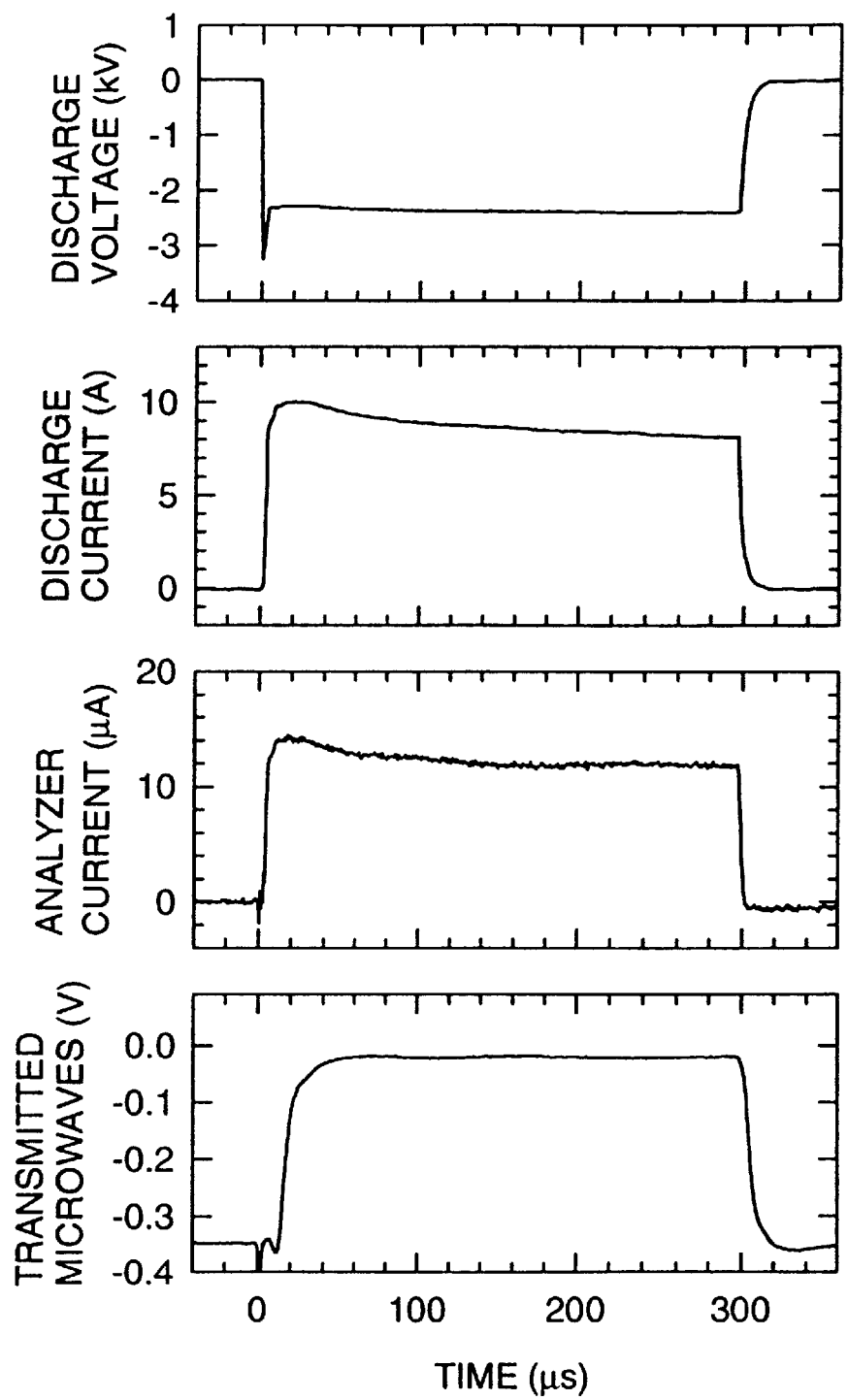
FIGS. 6(a)–(d) shows data, such as, the discharge voltage, discharge current, energy analyzer, and transmitted microwave signal; obtained with the slotted-tube cathode

Plasma electron densities were measured by recording the thru-transmission of microwaves as a function of the frequency. In the test fixture described, two 15-dB X-band horns were used, one for transmit 68 and one for receive 72. The horns 68 and 72 were placed 2 meters apart with the plasma sheet midway between the horns 68 and 72. Densities greater than $1\times10^{12}$ cm$^{-3}$ were measured by varying the microwave frequency. Densities less than $1\times10^{12}$ cm$^{-3}$ were measured by observing the thru-transmission as a function of incidence angle. A differentially pumped retarding field energy analyzer 74 mounted under the anode 56 plate was used to measure the energy distribution of the plasma electrons. FIG. 6 shows the data obtained with the slotted tube cathode 30 for a 52 mTorr, 2.4 kV, 8.5 A, 225 G discharge in oxygen. Shown in FIG. 6 are the traces for the (a) discharge voltage, (b) discharge current, (c) energy analyzer current for −100v bias voltage,and (d) the thru-transmitted microwave signal.

The cathode 48 described above has several advantages when compared to that described in the '496 patent. These distinct advantages offer greatly superior performance characteristics that are extremely valuable in building a plasma mirror based modern radar system. First and foremost, the cathode described herein can be operated "bare" (uninsulated) without the need for an external collimator to help define the discharge, as a result there are no triple points. This insures trouble free operation at high voltages enabling the generation of very large plasma mirrors which tend to require higher discharge voltages. As long as the magnetic field is above the transition field (150 G), the discharge is confined near the cathode to the interior of the cavity. Another benefit gained by using cathodes of the type described herein is the ease with which they may be densely packed to form an azimuthal array of linear cathodes for steering radar beams.

The cathode described herein, unlike that described in the '496 patent generates a quiescent plasma sheet-discharge that exhibits no high-frequency oscillations in the discharge current or in the location of the critical surface. This feature is extremely valuable in a radar system because most modern radars require superb clutter rejection capabilities. The longitudinal magnetic field causes electron motions within the cathode-cavity which tend to make the plasma density uniform across the width of the plasma sheet.

Another important advantage of the cathode described herein is that it is capable of generating large area, high density, plasma sheets nearly five times more efficiently than the prior art. This means that five times less discharge power input is required to attain the same plasma electron density. The absolute densities achieved are also much higher with the slotted-tube cathode for the same mirror area, and the plasma sheet is well confined, i.e., the sheet-thickness is smaller. Efficiency is important because an efficient discharge need less elaborate heat removal techniques, and such a discharge may be operated more easily at very high duty factors.

There are also much smaller time variations in the discharge parameters which means that cathodes with smaller cavity size may show similar performance. When a cathode is made smaller, the aspect ratio has to be kept the same; if this is not done a low-density, positive-column discharge may be obtained instead of the much desired high-density, negative-glow discharge column. Scalability is desirable because the cathodes may be more closely spaced, and much higher sheet-plasma densities may be achieved for the same discharge power input.

The advantages of a plasma mirror based radar have been discussed above, however, it is important to reiterate that the principle advantages are the low cost, high microwave-power-handling capability, and the very large instantaneous bandwidth which offers great freedom in the choice of radar transmit waveforms. It is possible to build an extremely capable plasma mirror based radar system operating simulKu-bands, i.e. the X- and Ku-bands, i.e., in the 6–18 GHz frequency range.

Although the invention has been described in relation to the exemplary embodiment thereof, it will be understood by those skilled in the art that still other variations and modifications can be affected in the preferred embodiment without detracting from the scope and spirit of the invention as stated in the claims.

What is claimed is:

1. An apparatus comprised of:
   means for generating a magnetic field;
   means for generating a discharge voltage;
   a cathode, within a vacuum chamber, of a predetermined length, circular in shape, having an inner cavity, and a slot of a predetermined width longitudinally along the cathode;
   an anode, within said vacuum chamber, positioned a predetermined distance from the cathode; and
   said means for generating a discharge voltage and means for generating a magnetic field cooperating to cause an equal discharge of electrons to be generated along the longitudinal length of said cathode inner cavity and discharged through the slot thereby producing a high-density plasma sheet between said cathode and said anode.

2. An apparatus comprised of:
   a vacuum chamber;
   means for generating a magnetic field surrounding said vacuum chamber;
   a cathode within said vacuum chamber of a predetermined length, circular in shape, having an inner cavity and a slot of a predetermined width longitudinally along the cathode closed off at each end with end caps;
   means for applying a discharge voltage to said end caps of said cathode;
   an anode within said vacuum chamber positioned a predetermined distance from the cathode; and
     said means for applying a discharge voltage to said end caps and means for generating a magnetic field cooperating to cause an equal discharge of electrons to be generated along the longitudinal length of said cathode inner cavity and discharged through the slot so as to form a high-density plasma sheet between said cathode and said anode.

3. An apparatus for generating a sheet plasma mirror comprised of:
   a vacuum chamber;
   a cylindrical cathode having an inner cavity with a slot of a predetermined width longitudinally positioned along the cathode located within the vacuum chamber and closed off with endcaps;
   means for applying a discharge voltage of a predetermined magnitude to the endcaps of said cathode;
   a plurality of coils outside of the vacuum chamber generating a magnetic field that cooperates with the means for applying a discharge voltage to the endcaps to cause an equal discharge of electrons to be generated along the longitudinal length of the cathode inner cavity;
   said magnetic field having a higher field strength than the field strength of a threshold magnetic field thereby causing the discharge of electrons to be generated within the inner cavity of the cathode; and
     an anode positioned a predetermined distance from said cavity, said electrons generated within said cathode inner cavity flowing from the slot of the cathode to the anode thereby forming a high-density, negative-glow plasma sheet immersed in the magnetic field, said plasma sheet having a thickness proportional to the size of the slot within the cathode.

4. A method for producing a sheet plasma mirror comprising the steps of:
   backfilling a vacuum chamber with a predetermine gas concentration at a predetermined pressure;
   applying a predetermined discharge voltage to a cylindrical cathode with an inner cavity and having a slot of a predetermined width longitudinally positioned along the cathode; and
   generating a magnetic field higher than a threshold magnetic field that cooperates with the discharge voltage to cause an equal discharge of electrons to be generated along the longitudinal length of the inner cavity of the cathode that flow through the slot toward an anode positioned a predetermined distance from the cathode thereby producing a sheet plasma mirror of a finite thickness.

* * * * *